United States Patent [19]

Ueno

[11] Patent Number: 5,136,253

[45] Date of Patent: Aug. 4, 1992

[54] PHASE COMPARATOR HAVING TWO DIFFERENT PHASE COMPARISON CHARACTERISTICS

[75] Inventor: Masaji Ueno, Tokyo, Japan

[73] Assignee: Kabushiki Kaisha Toshiba, Kawasaki, Japan

[21] Appl. No.: 581,304

[22] Filed: Sep. 12, 1990

[30] Foreign Application Priority Data

Sep. 14, 1989 [JP] Japan ................... 1-239203

[51] Int. Cl.[5] .................... H03D 13/00; H03K 9/06
[52] U.S. Cl. ............................. 328/133; 328/134;
328/155; 307/516; 307/262; 331/1 A
[58] Field of Search ............. 307/514, 516, 262;
328/133, 134, 155, 109; 331/1 A, 25, 49

[56] References Cited

U.S. PATENT DOCUMENTS

| 4,419,629 | 12/1983 | O'Brien ................. 331/49 |
| 4,495,468 | 1/1985 | Richards et al. ............ 328/134 |
| 4,521,745 | 6/1985 | Falconer ................ 331/49 |
| 4,593,254 | 6/1986 | Coburn ................. 331/1 A |
| 4,651,103 | 3/1987 | Grimes ................. 331/49 |
| 4,804,928 | 2/1989 | Chloupek et al. ............ 331/1 A |
| 4,853,653 | 8/1989 | Maher .................. 331/49 |
| 4,942,365 | 7/1990 | Satterwhite ............. 328/134 |

FOREIGN PATENT DOCUMENTS 0184700  6/1986  European Pat. Off. .

Primary Examiner—Timothy P. Callahan
Attorney, Agent, or Firm—Finnegan, Henderson, Farabow, Garrett and Dunner

[57] ABSTRACT

A phase comparator has a switching circuit controlled by a switch signal and a phase comparing unit. The switching circuit receives a reference pulse signal having a duty ratio of 50% and a reception data signal having a duty ratio of less than 50%. One of these signals is selected by the switching circuit on the basis of control of the switch signal. The selected signal and an output signal from a voltage-controlled oscillator are supplied to the phase comparing unit. The phase comparing unit compares phases of the two signals. When the phase of the output signal from the voltage-controlled oscillator lags behind the phase of the selected reference pulse signal or reception data signal, the phase comparing unit outputs a first pulse signal, having a width corresponding to a phase difference between the two signals, for advancing the phase of the output signal from the voltage-controlled oscillator. When the phase of the output signal from the voltage-controlled oscillator leads ahead of the phase of the selected reference pulse signal or reception data signal, the phase comparator outputs a second pulse signal, having a width corresponding to a phase difference between the two signals, for delaying the phase of the output signal from the voltage-controlled oscillator.

9 Claims, 6 Drawing Sheets

PHASE COMPARATOR HAVING TWO DIFFERENT PHASE COMPARISON CHARACTERISTICS

BACKGROUND OF THE INVENTION

1. Field of the Invention

The present invention relates to a phase comparator for use in a phase-locked loop and the like and, more particularly, to a phase comparator having two different phase comparison characteristics.

2. Description of the Related Art

In an integrated circuit for write/read control in a magnetic disk or an integrated circuit for communication control, not only a pulse signal waveform having a duty ratio of 50%, but also a signal waveform (a pulse signal waveform having a duty ratio of less than 50%), is sometimes used in a certain time period, although the signal waveform changes in accordance with the type of modulating system. In order to perform phase comparison for such a signal waveform by using a phase comparator, phase comparison must be performed only when an input pulse is present. A phase-locked loop having two phase comparison characteristics for a pulse signal having a duty ratio of 50% and a pulse signal having a duty ratio of less than 50% is described in, e.g., U.S. Pat. No. 4,593,254. A "VCO centering circuit" described in U.S. Pat. No. 4,593,254 has a first phase comparator for receiving a reference pulse signal having a duty ratio of 50% as a comparison input signal from a quartz oscillator and a second phase comparator for receiving reception data having a duty ratio of less than 50% as a comparison input signal. Outputs from the first and second phase comparators are subjected to a selection operation by a multiplexer. That is, this multiplexer selects one of the outputs from the first and second phase comparators. An output from the multiplexer is converted into a predetermined signal waveform by a charge pump circuit. An output from the charge pump circuit is smoothed into a DC signal by a low-pass filter. An output from the low-pass filter is supplied to a voltage-controlled oscillator (to be abbreviated to as a VCO hereinafter). A signal having a frequency corresponding to the output level from the low-pass filter is generated by the VCO and supplied as a comparison reference signal to the first and second phase comparators.

When a phase of the comparison reference signal (output signal from the VCO) leads ahead of that of the comparison input signal, the first and second phase comparators output control signals for delaying the phase of the output signal from the VCO. When the phase of the output signal from the VCO lags behind that of the comparison input signal, the first and second phase comparators output control signals for advancing the phase of the output signal from the VCO. The charge pump circuit outputs a signal of the positive or negative level in a time period corresponding to a duration of the control signal for advancing or delaying the phase of the signal selected by the multiplexer and keeps an output node in a floating state in the other period.

In the phase-locked loop having the above arrangement, however, since two phase comparators each having a comparatively large number of elements are used, the number of constituting elements of the circuit is increased. In addition, if the first and second phase comparators are constituted by a CMOS circuit, although consumption power is low when the loop is used in a low-frequency region, it is largely increased in a high-frequency region. If the first and second phase comparators are constituted by a TTL (transistor-transistor logic) circuit or an ECL (emitter-coupled logic) circuit, although consumption power is not much increased in a high-frequency region unlike in a CMOS circuit, a considerable amount (larger than the amount used in a CMOS circuit) of power is consumed throughout low to high-frequency regions.

SUMMARY OF THE INVENTION

It is, therefore, an object of the present invention to provide a phase comparator which can reduce the number of elements and realize low consumption power.

The above object of the present invention is achieved by a phase comparator comprising: a switching circuit for receiving first and second comparison input signals having different duty ratios and selecting one of the first and second comparison input signals on the basis of a switch signal; and a phase comparing unit for receiving a comparison reference signal and one of the first and second comparison input signals selected by the switching circuit, performing phase comparison between these signals, and outputting a signal having a pulse width corresponding to a phase difference.

With the above arrangement, one of two desired phase comparison characteristics can be selected by switching connections of peripheral circuits to a basic circuit (phase comparing unit). Therefore, since only one basic circuit having a comparatively large number of elements need be used, the number of elements is reduced to realize low consumption power and a small chip area.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description: of the preferred embodiments given below, serve to explain the principles of the invention.

DETAILED DESCRIPTION OF THE PREFERRED EMBODIMENTS

An embodiment of the present invention will be described in detail below with reference to the accompanying drawings.

Figure 1:
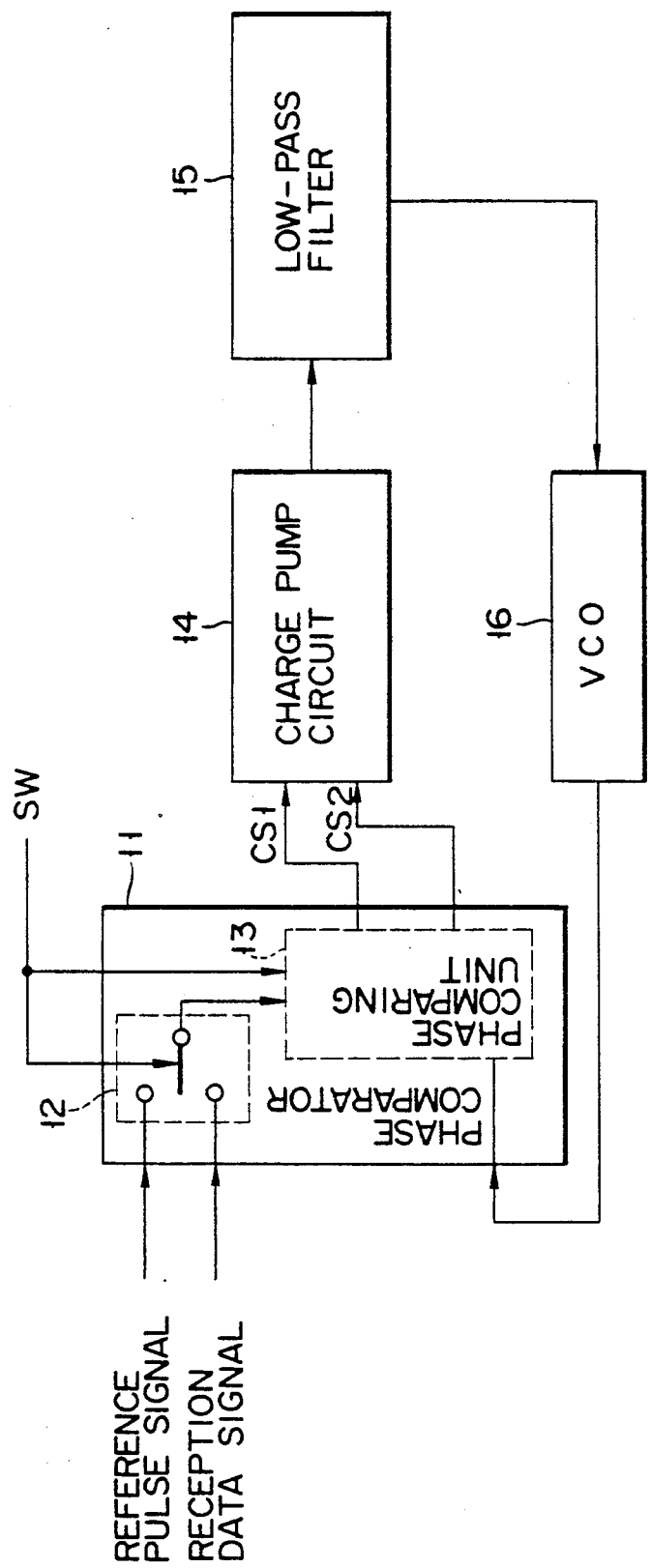
FIG. 1 is a block diagram showing a schematic arrangement of a phase-locked loop using a phase comparator according to an embodiment of the present invention.

FIG. 1 is a block diagram showing a schematic arrangement of a phase-locked loop using a phase comparator according to the present invention. A comparator 11 has a switching circuit 12 and a phase comparing unit 13 which are controlled by a switch signal SW. The switching circuit 12 arranged in the phase comparator 11 receives a reference pulse signal supplied from a quartz oscillator and having a duty ratio of 50% and, e.g., a reception data signal having a duty ratio of less than 50%. The reference pulse signal and the reception data signals are supplied as comparison input signals of the phase comparator 11. One of these signals is selected by the switching circuit 12 on the basis of control of the switch signal SW and supplied to the phase comparing unit 13. Output signals CS1 and CS2 from the phase comparing unit 13 are supplied to a charge pump circuit 14 and converted into a predetermined signal waveform. An output signal from the charge pump circuit 14 is smoothed into a DC signal by a low-pass filter 15. An output signal from the low-pass filter 15 is supplied to a VCO 16. A signal having a frequency corresponding to the output level from the low-pass filter 15 is generated by the VCO 16 and supplied as a comparison reference signal to the phase comparing unit 13 of the phase comparator 11.

Figure 2:
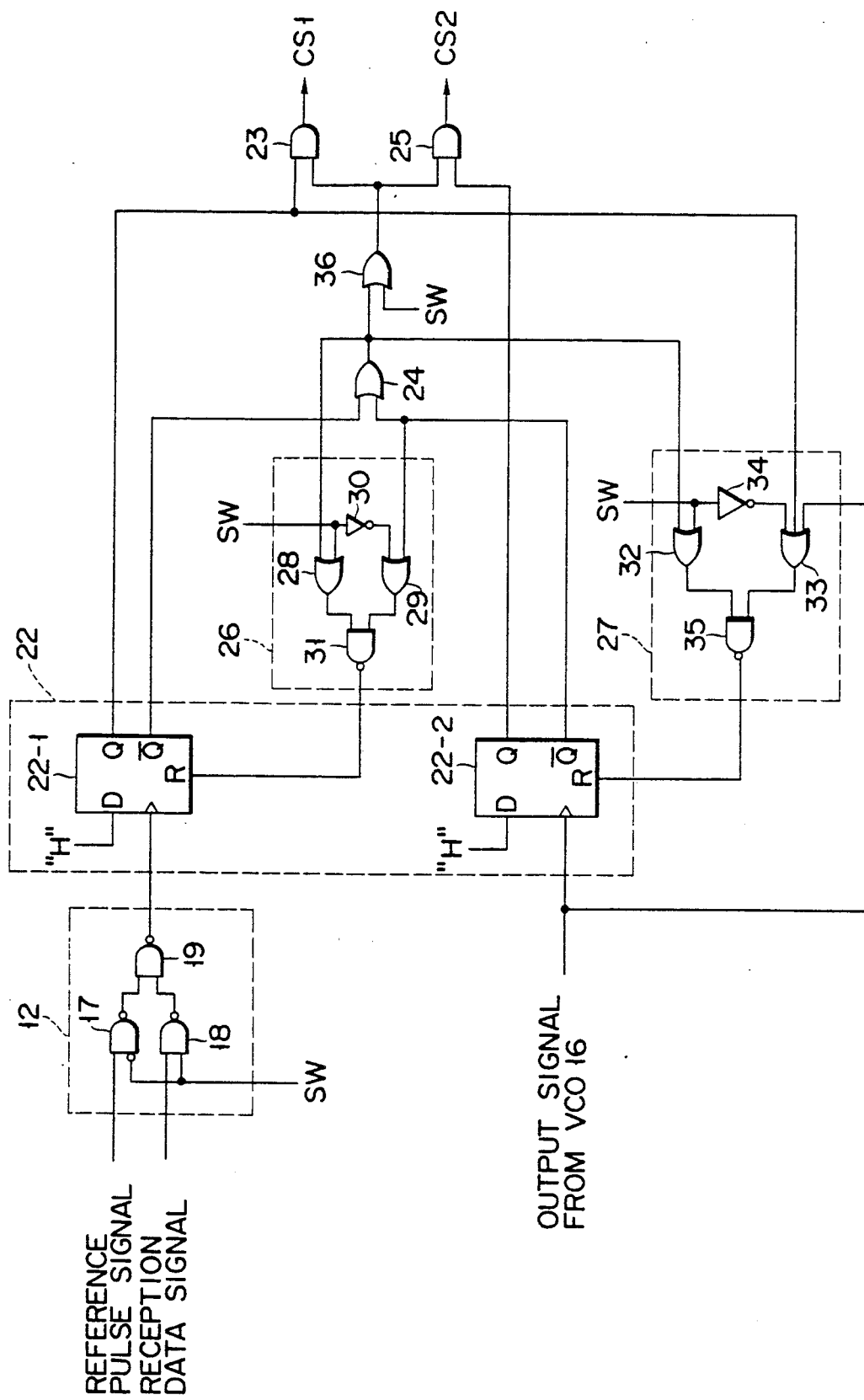
FIG. 2 is a circuit diagram showing an arrangement of the phase comparator shown in FIG. 1.

FIG. 2 shows a detailed arrangement of the phase comparator 11 of the phase-locked loop shown in FIG. 1. The switching circuit 12 includes NAND gates 17, 18, and 19. The reference pulse signal is supplied to one input terminal of the NAND gate 17, and an inverted signal of the switch signal SW is supplied to its other input terminal. The reception data signal is supplied to one input terminal of the NAND gate 18, and the switch signal SW is supplied to its other input terminal. Output signals from the NAND gates 17 and 18 are respectively supplied to one and the other input terminals of the NAND gate 19. An output signal from the NAND gate 19 is supplied to the trigger input terminal of a first D flip-flop circuit 22-1. A signal of level "H" is applied to a data input terminal D of the flip-flop circuit 22-1. A Q output of the flip-flop circuit 22-1 is supplied to one input terminal of an AND gate 23, and its inverted $\bar{Q}$ output is supplied to one input terminal of an OR gate 24. An output signal from the VCO 16 is supplied as a comparison reference signal to the trigger input terminal of a second D flip-flop circuit 22-2. A signal of level "H" is applied to a data input terminal D of the flip-flop circuit 22-2. A Q output of the flip-flop circuit 22-2 is supplied to one input terminal of an AND gate 25, and its inverted $\bar{Q}$ output is supplied to the other input terminal of the OR gate 24. The flip-flop circuits 22-1 and 22-2 constitute a basic circuit 22 of the phase comparator 11. Reset signals from first and second reset circuits 26 and 27 are respectively supplied to reset input terminals R of the flip-flop circuits 22-1 and 22-2. The first reset circuit 26 includes OR gates 28 and 29, an inverter 30, and a NAND gate 31. An output signal from the OR gate 24 is supplied to one input terminal of the OR gate 28, and the switch signal SW is supplied to its other input terminal. The switch signal SW inverted by the inverter 30 is supplied to one input terminal of the OR gate 29, and an inverted $\bar{Q}$ output from the flip-flop circuit 22-2 is supplied its other input terminal. Output signals from the OR gates 28 and 29 are respectively supplied to one and the other input terminals of the NAND gate 31. An output signal from the NAND gate 31 is supplied to the reset input terminal R of the flip-flop circuit 22-1.

The second reset circuit 27 includes OR gates 32 and 33, an inverter 34, and a NAND gate 35. An output signal from the OR gate 24 is supplied to one input terminal of the OR gate 32, and the switch signal SW to its input terminal. The switch signal SW inverted by the inverter 34 is supplied to the first input terminal of the OR gate 33, a Q output from the flip-flop circuit 22-1 is supplied to its second input terminal, and an output signal from the VCO 16 is supplied to its third input terminal. Output signals from the OR gates 32 and 33 are respectively supplied to one and the other input terminals of the NAND gate 35. An output signal from the NAND gate 35 is supplied to the reset input terminal R of the flip-flop circuit 22-2.

An output signal from the OR gate 24 is supplied to one input terminal of an OR gate 36, and the switch signal SW is supplied to its other input terminal. An output signal from the OR gate 36 is supplied to the other input terminal of each of the AND gates 23 and 25.

When a phase of the comparison reference signal (output signal from the VCO 16) lags behind that of the comparison input signal (reference pulse signal or reception data signal), a control signal CS1 for advancing the phase of the signal output from the VCO 16 is output from the output terminal of the AND gate 23. When the phase of the comparison reference signal leads ahead of that of the comparison input signal, a control signal CS2 for delaying the phase of the output signal from the VCO 16 is output from the output terminal of the AND gate 25.

Figure 3:
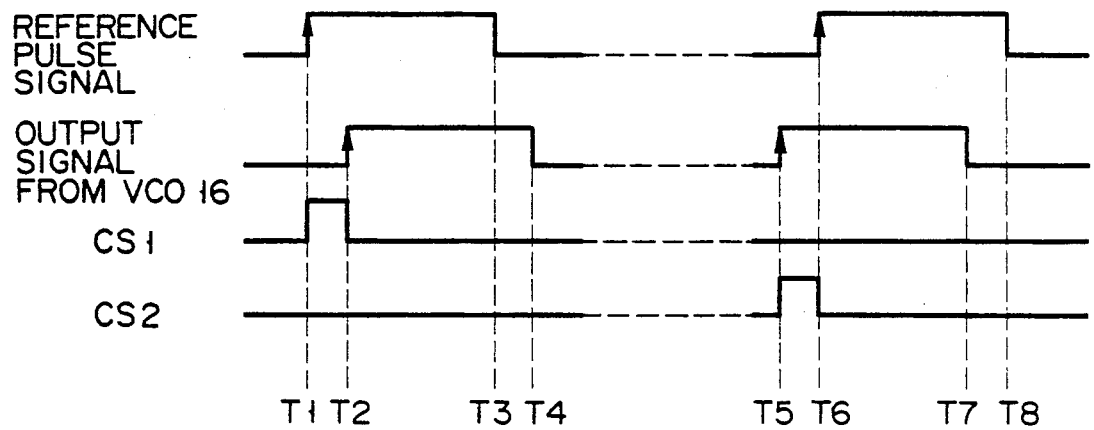
FIG. 3 is a timing chart for explaining an operation of the phase comparator shown in FIG. 2, showing signals obtained when a switch signal is at level "L"
Figure 4:
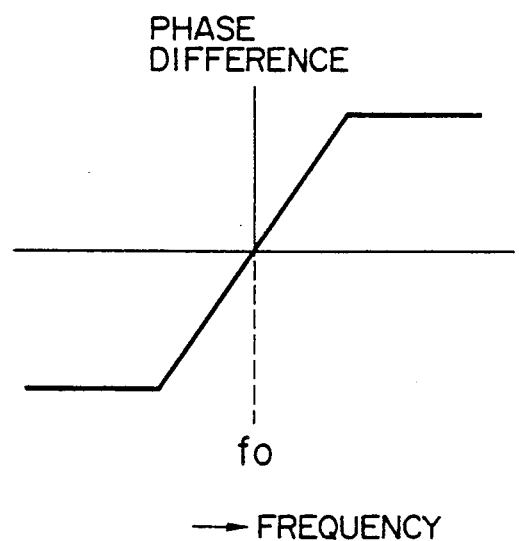
FIG. 4 is a graph showing a relationship between a frequency and a phase difference when the switch signal of the circuit shown in FIG. 2 is at level "L"
Figure 5:
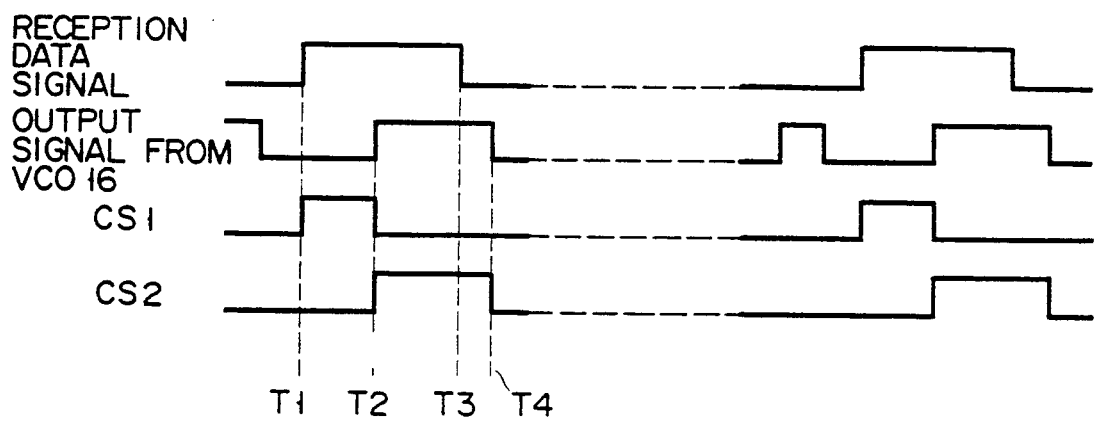
FIG. 5 is a timing chart for explaining an operation of the phase comparator shown in FIG. 2, showing signals obtained when the switch signal is at level "H"
Figure 6:
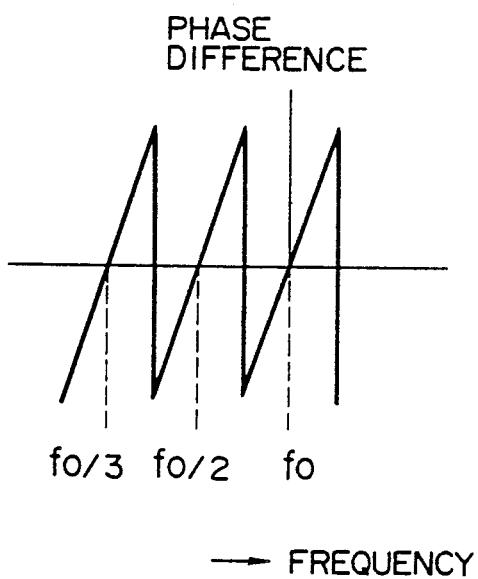
FIG. 6 is a graph showing a relationship between the frequency and the phase difference obtained when the switch signal of the circuit shown in FIG. 2 is at level "H"

An operation of the phase comparator shown in FIG. 2 will be described below with reference to FIGS. 3 to 6. FIG. 3 is a timing chart showing the reference pulse signal, the output signal from the VCO 16, and the control signals CS1 and CS2 obtained when the switch signal SW is at level "L", and FIG. 4 is a graph showing phase characteristics obtained in this state. FIG. 5 is a timing chart showing the reception data signal, the output signal from the VCO 16, and the control signals CS1 and CS2 obtained when the switch signal SW is at level "H", and FIG. 6 is a graph showing phase characteristics obtained in this state.

Assume that the reset terminals R of the flip-flop circuits 22-1 and 22-2 are at level "L" and their Q outputs are at level "L" (their inverted $\bar{Q}$ outputs are at level "H"). When the switch signal SW is at level "L", the reference pulse signal is selected by the switching circuit 12. That is, since an output from the NAND gate 18 is fixed to level "H" by the level "L" of the switch signal SW, the reference pulse signal is inverted by the NAND gate 17, inverted again by the NAND gate 19, and supplied to the trigger input terminal of the flip-flop circuit 22-1. As shown in FIG. 3, when the reference pulse signal rises at a timing T1, the Q output of the flip-flop circuit 22-1 is inverted to level "H", and its inverted $\overline{Q}$ output goes to level "L". If the output signal from the VCO 16 is at a predetermined level (level "L" in FIG. 3), since the Q output of the flip-flop circuit 22-2 is at level "L" and its inverted $\overline{Q}$ output is at level "H", the level "H" of the inverted $\overline{Q}$ output is supplied to the AND gates 23 and 25 via the OR gates 24 and 36, respectively. As a result, the output signal (control signal for advancing the phase) CS1 from the AND gate 23 goes to level "H". At this time, since the Q output of the flip-flop circuit 22-2 is at level "L", the output signal (control signal for delaying the phase) CS2 from the AND gate 25 goes to level "L".

In this case, since the output from the OR gate 24 is at level "H", the output from the OR gate 28 of the reset circuit 26 goes to level "H". In addition, since the inverted $\overline{Q}$ output from the flip-flop circuit 22-2 is at level "H" and the output from the inverter 30 is at level "H" too, the output from the OR gate 29 goes to level "H". Therefore, the output signal from the NAND gate 31 is at level "L", and the flip-flop circuit 22-1 is not reset. Meanwhile, since the output from the 0R gate 24 is at level "H", the output from the OR gate 32 of the reset circuit 27 goes to level "H". In addition, since the Q output of the flip-flop circuit 22-1 is at level "H" and the output from the inverter 34 is at level "H" too, the output from the OR gate 33 goes to level "H" regardless of the level of the output signal from the VCO 16. Therefore, the output from the NAND gate 36 goes to level "L", and the flip-flop circuit 22-2 is not reset.

When the output signal from the VCO 16 rises to level "H" at a timing T2, the Q output of the flip-flop circuit 22-2 is inverted to level "H", and its inverted $\overline{Q}$ output is inverted to level "L". Therefore, the outputs from the OR gates 24 and 36 go to level "L", and the output signal CS1 from the AND gate 23 goes to level "L". At this time, the output from the OR gate 28 goes to level "L", the output from the OR gate 29 goes to level "L", and the output from the NAND gate 31 goes to level "H", thereby resetting the flip-flop circuit 22-1. In addition, since the output from the OR gate 32 goes to level "L", the output from the OR gate 33 goes to level "L", and the output from the NAND gate 35 goes to level "H", the flip-flop circuit 22-2 is reset. Since the Q output and the inverted $\overline{Q}$ output of each of the flip-flop circuits 22-1 and 22-2 go to levels "L" and "H", respectively, when the circuits 22-1 and 22-2 are reset, the output from the OR gate 24 goes to level "H". Therefore, the OR gates 28 and 32 are inverted to level "H", and the outputs from the NAND gates 31 and 35 go to level "L". As a result, resetting of the flip-flop circuits 22-1 and 22-2 is released, and an initial state is returned.

When the reference pulse falls at a timing T3 and the output signal from the VCO 16 falls at a timing T4, the flip-flop circuits 22-1 and 22-2 are kept reset, and an operation state of the circuit remains unchanged.

Contrary to this, when the output signal from the VCO 16 rises to level "H" at a timing T5, the Q output of the flip-flop circuit 22-2 goes to level "H", and its inverted $\overline{Q}$ output goes to level "L". At this time, if the reference pulse signal is at level "L", the Q output of the flip-flop circuit 22-1 goes to level "L", and its inverted $\overline{Q}$ output goes to level "H". Therefore, the outputs from the OR gates 24 and 36 go to level "H". As a result, the output signal CS2 from the AND gate 25 goes to level "H". At this time, since the Q output of level "L" is supplied from the flip-flop circuit 22-1 to one input terminal of the AND gate 23, the output signal CS1 goes to level "L". In addition, since the output from the OR gate 24 is at level "H", both the output signals from the reset circuits 26 and 27 (the output signals from the NAND gates 31 and 35) go to level "L".

Subsequently, when the reference pulse signal rises to level "H" at a timing T6, the Q output from the flip-flop circuit 22-1 goes to level "H", and the inverted $\overline{Q}$ output goes to level "L". Therefore, the outputs from the OR gates 24 and 36 go to level "L", and the output signal from the AND gate 25 goes to level "L". Since the output from the OR gate 24 goes to level "L", both the outputs from the OR gates 28 and 32 go to level "L", and the outputs from the NAND gates 31 and 35 go to level "H". As a result, the flip-flop circuits 22-1 and 22-2 are reset.

Thereafter, the output from the VCO 16 falls to level "L" at a timing T7, and the reference pulse signal falls to level "L" at a timing T8. At this time, the outputs from the AND gates 23 and 25 and the NAND gates 31 and 35 are kept at level "L".

As described above, since phase comparison of two inputs is continuously performed when the switch signal SW is at level "L", a comparison output of a pulse having a width corresponding to a phase difference of the two inputs throughout a wide frequency range with reference to a certain frequency $f_0$ (a frequency of a desired output signal from the VCO 16) is generated as a phase comparison characteristic. Therefore, an adjustable frequency band of the phase-locked loop is wide.

When the switch signal SW is at level "H", a reception data signal is selected by the switching circuit 12. Since an output from the NAND gate 17 is fixed at level "H", the reception data signal is supplied to one input terminal of the NAND gate 18. Since the switch signal SW at level "H" is supplied to the other input terminal of the NAND gate 18, an inverter operation is performed. An output from the NAND gate 18 is inverted and supplied to the trigger input terminal of the flip-flop circuit 22-1.

As shown in FIG. 5, when the reception data signal rises at a timing T1, the Q output of the flip-flop circuit 22-1 is inverted to level "H", and its inverted $\overline{Q}$ output is inverted to level "L". Since an output signal from the OR gate 36 goes to level "H" by the level "H" of the switch signal SW, the output signal (control signal for advancing the phase) CS1 from the AND gate 23 goes to level "H". At this time, since an output signal from the VCO 16 is at level "L", the Q output of the flip-flop circuit 22-2 is at level "L", and its inverted $\overline{Q}$ output is at level "H". Therefore, the output signal (control signal for delaying the phase) CS2 from the AND gate 25 goes to level "L".

In this case, since the output from the OR gate 24 is at level "H" and the switch signal SW is at level "H", the output from the OR gate 28 of the reset circuit 26 is at level "H". The output from the OR gate 29 goes to level "H" by the level "H" of the inverted $\overline{Q}$ output of the flip-flop circuit 22-2. Therefore, the output signal from the NAND gate 31 is at level "L", and the flip-flop circuit 22-1 is not reset. Meanwhile, since the output from the OR gate 24 is at level "H" and the switch signal SW is at level "H" too, the output from the OR gate 32 of the reset circuit 27 goes to level "H". In addition, the output from the OR gate 33 goes to level "H" by the level "H" of the Q output of the flip-flop circuit 22-1 regardless of the level of the output signal from the VCO 16. Therefore, the output signal from the NAND gate 35 goes to level "L", and the flip-flop circuit 22-2 is not reset.

When the output signal from the VCO 16 rises to level "H" at a timing T2, the Q output of the flip-flop circuit 22-2 is inverted to level "H" and its inverted $\overline{Q}$ output is inverted to level "L". Since the output from the OR gate 36 is kept at level "H", the output signal CS2 from the AND gate 25 goes to level "H". At this time, the output from the OR gate 24 goes to level "L", the output from the OR gate 28 goes to level "H", the output from the OR gate 29 goes to level "L", and the output from the NAND gate 31 goes to level "H", thereby resetting the flip-flop circuit 22-1. Therefore, since the Q output of the flip-flop circuit 22-1 goes to level "L", the output signal CS1 from the AND gate 23 goes to level "L". In addition, the output from the OR gate 32 goes to level "H", the output from the OR gate 33 goes to level "H" because the output signal from the VCO 16 is at level "H", and the output from the NAND gate 35 goes to level "L". Therefore, the flip-flop circuit 22-2 is not reset.

When the reception data signal falls to level "L" at a timing T3, the flip-flop circuit 22-1 is kept reset, and an operation state of the circuit remains unchanged.

Subsequently, when the output signal from the VCO 16 falls to level "L" at a timing T4, the Q output of the flip-flop circuit 22-2 goes to level "L", and its inverted $\overline{Q}$ output goes to level "H". Therefore, the output signal CS2 from the AND gate 25 goes to level "L". At this time, a signal of level "L" obtained by inverting the switch signal SW is supplied to the first input terminal of the OR gate 33, the Q output of level "L" of the flip-flop circuit 22-1 is supplied to its second input terminal, and a signal of level "L" output from the VCO 16 is supplied to its third input terminal. Therefore, an output from the OR gate 33 goes to level "L". Meanwhile, since signals of level "H" are supplied to one and the other input terminals of the OR gate 32, an output from the OR gate 32 goes to level "H". Therefore, since an output from the NAND gate 35 goes to level "H", the flip-flop circuit 22-2 is reset, and its Q output and inverted $\overline{Q}$ output go to levels "L" and "H", respectively.

After the timing T4, the above operations at the timings T1 to T4 are sequentially repeated.

In this manner, when the switch signal SW is at level "H", phase comparison is performed only when a reception data signal is input. Therefore, as shown in FIG. 6, a comparison output of a pulse having a width corresponding to a phase difference of the two inputs within a narrow frequency range with reference to a plurality of a frequency $f_0$ (a frequency of a desired output from the VCO 16), a frequency $f_0/2$, and a frequency $f_0/3$ is generated as a phase comparison characteristic. Therefore, an adjustable frequency band of the phase-locked loop is narrow.

As described above, by switching connection of the peripheral circuit of the basic circuit 22, the phase comparator 11 shown in FIG. 2 can select one of the two phase comparison characteristics. Since only one basic circuit (two flip-flop circuits 22-1 and 22-2) having a comparatively large number of elements need be used, the number of elements and consumption power can be reduced. In addition, when the phase comparator of the present invention is applied to a phase-locked loop, the number of elements can be reduced since no multiplexer need be used. As a result, low consumption power and a small chip area can be realized. Furthermore, by using an ECL circuit as each of the reset circuits 26 and 27, the OR gates 24 and 36, and the AND gates 23 and 25, the number of elements and the consumption power can be further reduced.

Figure 7:
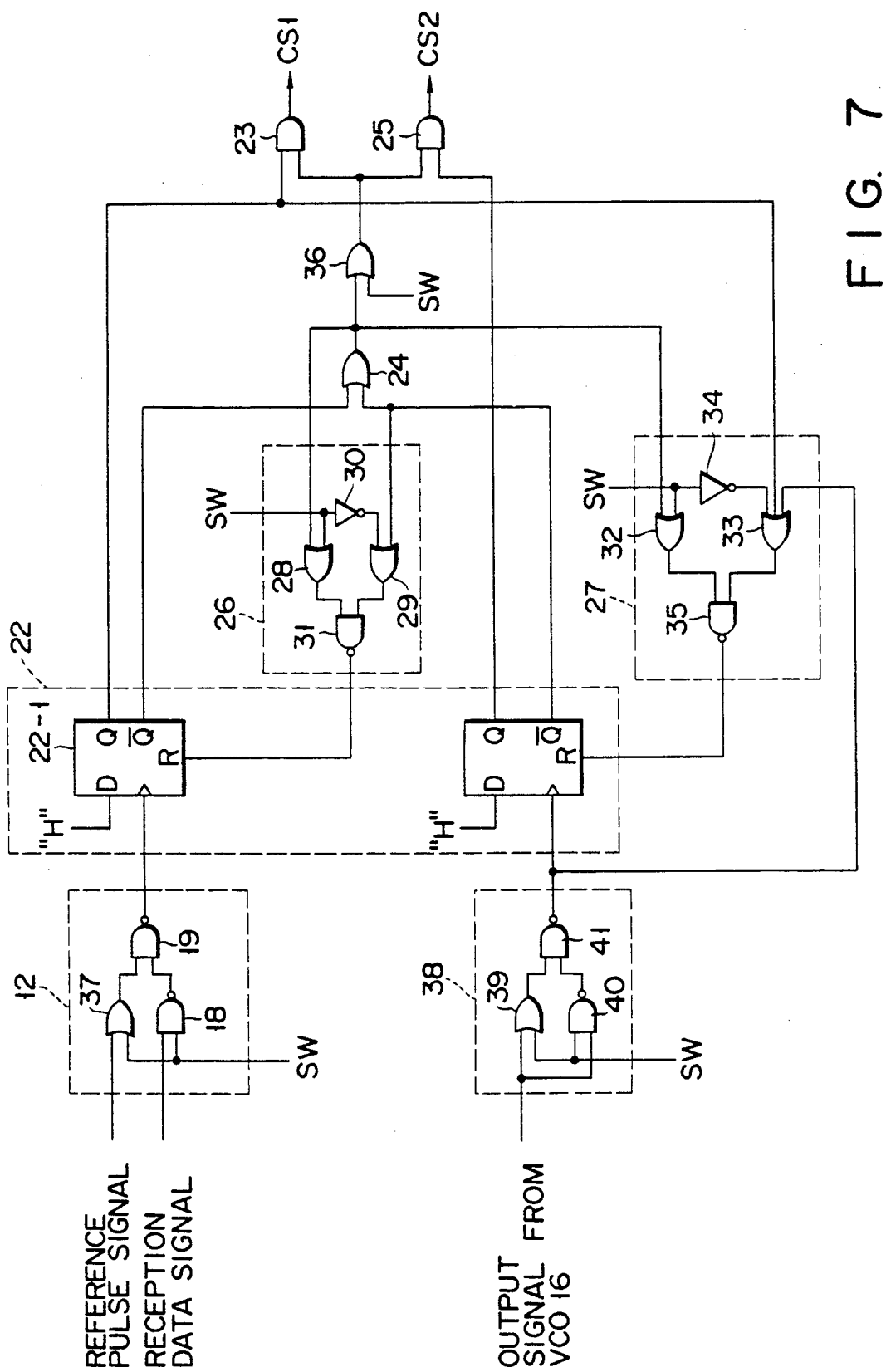
FIG. 7 is a circuit diagram showing another arrangement of the phase comparator shown in FIG. 1.

FIG. 7 shows another arrangement of the phase comparator 11 shown in FIG. 1. In FIG. 7, the same reference numerals as in FIG. 2 denote the same parts and a detailed description thereof will be omitted. In the following description, only a portion different from that of the arrangement shown in FIG. 2 will be explained. That is, an OR gate 37 is used instead of the NAND gate 17 of the switching circuit 12 shown in FIG. 2, and a switching circuit 38 is provided at the input terminal of a flip-flop circuit 22-2. A reception data signal is supplied to one input terminal of the OR gate 37, and a switch signal SW is supplied to its other input terminal. An output signal from the OR gate 37 is supplied to one input terminal of a NAND gate 19. The switching circuit 38 includes an OR gate 39 and NAND gates 40 and 41. An output signal from a VCO 16 is supplied to one input terminal of each of the OR gate 39 and the NAND gate 40, and the switch signal SW is supplied to the other input terminal thereof. Output signals from the OR gate 39 and the NAND gate 40 are supplied to one and the other input terminals of the NAND gate 41, respectively. An output signal from the NAND gate 41 is supplied to the trigger input terminal of the flip-flop circuit 22-2 and the third input terminal of an OR gate 33.

Figure 8:
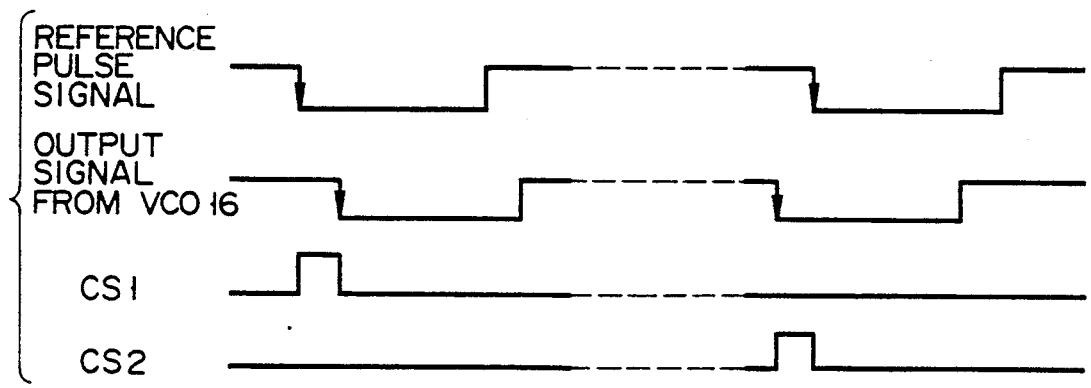
FIG. 8 is a timing chart for explaining an operation of the phase comparator shown in FIG. 7, showing signals obtained when the switch signal is at level "L".

In the above arrangement, as shown in FIG. 8, the levels of the reference pulse signal and the output signal from the VCO 16 obtained when the switch signal SW is at level "L" are different (inverted) from those of the circuit shown in FIG. 2, and only the outputs from the flip-flop circuits 22-1 and 22-2 are inverted at the trailing edges of these signals. Therefore, substantially the same operation as that of the circuit shown in FIG. 2 is basically performed, and the same effect can be obtained.

Note that the present invention is not limited to the above embodiments but can be variously modified. For example, a logic arrangement of the switching circuits 12 and 38 and the reset circuits 26 and 27 or an arrangement of the peripheral circuit can be variously modified.

As has been described above, the phase comparator according to the present invention can reduce the number of elements to realize low consumption power and a small chip area. Therefore, the phase comparator can be suitably incorporated in an integrated circuit for write-/read control in a magnetic disk or an integrated circuit for communication control.

What is claimed is:

1. A phase comparator comprising:
   switching means for receiving a switch signal, and first and second comparison input signals having different duty ratios, and for selecting the first comparison input signal when the switch signal is at a first logic level and the second comparison input signal when the switch signal is at a second logic level;
   a first D flip-flop circuit having a trigger input terminal for receiving one of the first and second comparison input signals selected by said switching means and a data input terminal for receiving a level "H" signal;
   a second D flip-flop circuit having a trigger input terminal for receiving an output signal from a voltage-controlled oscillator and a data input terminal for receiving a level "H" signal;

pulse signal output means, coupled to said first and second D flip-flop circuits, for outputting a first control signal for advancing a phase of an output signal from said voltage-controlled oscillator and a second control signal for delaying the phase of the output signal from said voltage-controlled oscillator based on output signals from said first and second D flip-flop circuits and the switch signal;

first reset means, coupled to said first and second D flip-flop circuits, for outputting a reset signal to said first D flip-flop circuit based on the output signals from said first and second D flip-flop circuits and the switch signal; and second reset means, coupled to said first and second D flip-flop circuits, for outputting a reset signal to said second D flip-flop circuit based on the output signals from said first and second D flip-flop circuits and the switch signal.

2. A comparator according to claim 1, wherein the first comparison input signal is a reference pulse signal having a duty ratio of 50%.

3. A comparator according to claim 1, wherein the second comparison input signal is a reception data signal having a duty ratio of less than 50%.

4. A comparator according to claim 1, wherein the comparison reference signal is an output signal from a voltage-controlled oscillator.

5. A comparator according to claim 1, wherein said pulse signal output means includes first logic means for ORing an inverted output from said first D flip-flop circuit and an inverted output from said second D flip-flop circuit, second logic means for ORing an output from said first logic means and the switch signal, third logic means for ANDing an output from said second logic means and the output from said first D flip-flop circuit and outputting the first control signal, and fourth logic means for ANDing an output from said second logic means and the output from said second D flip-flop circuit and outputting the second control signal.

6. A comparator according to claim 5, wherein said first D flip-flop circuit is set in response to a rising edge of one of the first and second comparison input signals selected by said switching means, and said second D flip-flop circuit is set in response to a rising edge of the output from said voltage-controlled oscillator.

7. A comparator according to claim 5, further comprising inverting means for inverting the output signal from said voltage-controlled oscillator in response to the switch signal, wherein said first D flip-flop circuit is set in response to a falling edge of one of the first and second comparison input signals selected by said switch means, and said second D flip-flop circuit is set in response to a falling edge of the output signal from said voltage-controlled oscillator.

8. A comparator according to claim 5, wherein said first reset means outputs the reset signal when the switch signal is at level "L" and the output from said first logic means is at level "L", and when the switch signal is at level "H" and the output from said first logic means is at level "L".

9. A comparator according to claim 5, wherein said second reset means outputs the reset signal when the switch signal is at level "L" and the output from said first logic means is at level "L", and when the switch signal is at level "H", the output from said first D flip-flop circuit is at level "L", and the output signal from said voltage-controlled oscillator is at level "L".

* * * * *